United States Patent
Mitsubori et al.

(10) Patent No.: US 8,164,372 B2
(45) Date of Patent: Apr. 24, 2012

(54) SEMICONDUCTOR DEVICE HAVING LEVEL SHIFT CIRCUIT, CONTROL METHOD THEREOF, AND DATA PROCESSING SYSTEM

(75) Inventors: Shingo Mitsubori, Tokyo (JP); Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 53 days.

(21) Appl. No.: 12/923,071

(22) Filed: Aug. 31, 2010

(65) Prior Publication Data

US 2011/0062998 A1 Mar. 17, 2011

(30) Foreign Application Priority Data

Sep. 11, 2009 (JP) ................................. 2009-210200

(51) Int. Cl.
*H03L 7/06* (2006.01)
*G11C 7/00* (2006.01)

(52) U.S. Cl. ........ 327/158; 327/149; 327/153; 327/161; 365/189.11; 365/233.1; 713/401

(58) Field of Classification Search .................. 327/149, 327/153, 158, 161; 365/198.11, 233.1–233.13, 365/233.16–233.19; 713/400, 401
See application file for complete search history.

(56) References Cited

U.S. PATENT DOCUMENTS

| 6,339,553 | B1 | 1/2002 | Kuge | |
|---|---|---|---|---|
| 6,829,715 | B2 * | 12/2004 | Chiao et al. | 713/401 |
| 7,888,966 | B1 * | 2/2011 | Davidson et al. | 326/62 |
| 7,940,580 | B2 * | 5/2011 | Schreiber et al. | 365/189.11 |
| 7,965,116 | B2 * | 6/2011 | Hatano et al. | 327/153 |

FOREIGN PATENT DOCUMENTS

JP 2001-84763 A 3/2001

* cited by examiner

*Primary Examiner* — Patrick O Neill
(74) *Attorney, Agent, or Firm* — McGinn IP Law Group PLLC

(57) ABSTRACT

To include a first level shift circuit that converts a first internal clock signal having an amplitude value of a first voltage into a second internal clock signal having an amplitude value of a second voltage, a second level shift circuit that converts a first internal data signal having the amplitude value of the first voltage into a second internal data signal having the amplitude value of the second voltage, a clock dividing circuit that generates third and fourth internal clock signals, which are complementary signals, based on the second internal clock signal, and an output circuit that outputs external data signals continuously from a data output terminal in synchronization with the third and fourth internal clock signals based on the second internal data signal. According to the present invention, because a level shift of a signal is performed before it is input to the output circuit, there occurs no skew in output data.

20 Claims, 10 Drawing Sheets

US 8,164,372 B2

SEMICONDUCTOR DEVICE HAVING LEVEL SHIFT CIRCUIT, CONTROL METHOD THEREOF, AND DATA PROCESSING SYSTEM

BACKGROUND OF THE INVENTION

1. Field of the Invention

The present invention relates to a semiconductor device and a control method thereof, and more particularly relates to a semiconductor device in which an amplitude value of a voltage of an external data signal and an amplitude value of a voltage of an internal data signal are different from each other and a control method thereof. The present invention also relates to a data processing system that includes the semiconductor device.

2. Description of Related Art

In a semiconductor device such as a DRAM (Dynamic Random Access Memory), a system for reducing power consumption is employed, in which an internal voltage that is lower than an external voltage is generated inside the semiconductor device and various peripheral circuits are operated with the internal voltage. In this case, because there is a difference between an amplitude value of a voltage of an internal signal and an amplitude value of a voltage of an external signal, it is necessary to insert a level shift circuit in a data path, thereby data is output to outside after converting the amplitude value of the internal voltage into the amplitude value of the external voltage.

As for a clock signal, although the amplitude value of the internal voltage is used in most peripheral circuits, a clock signal of which an amplitude value is converted into the amplitude value of the external voltage is required for a circuit portion that takes synchronization with data of which an amplitude value is converted into the amplitude value of the external voltage. Therefore, it is also necessary to insert a level shift circuit in a clock path for the clock signal, thereby the amplitude value of the clock signal is converted from the amplitude value of the internal voltage into the amplitude value of the external voltage.

For example, in FIG. 2 of U.S. Pat. No. 6,339,553, level shifters 130 and 135 are inserted right before a pulse generating circuit 160, which is a final stage of a DLL circuit 100, thereby an amplitude value of a voltage of an internal clock signal int.CLKP output from the DLL circuit 100 is converted into an amplitude value of an external voltage.

However, if the amplitude value of the voltage of the internal clock signal output from the DLL circuit is converted into the amplitude value of the external voltage as in the semiconductor device described in U.S. Pat. No. 6,339,553, it is not possible to fully achieve power consumption reducing effect, because all circuits that use an output of the DLL circuit have to be operated with the external voltage. Therefore, in order to further reduce the power consumption, it is required to further reduce the number of circuits that are operated with the external voltage by arranging the level shift circuit at a far latter stage.

An output circuit (an output buffer) is located at the last stage as a circuit for outputting data to outside. With the output circuit, it becomes possible to minimize the power consumption when all circuits prior to the output circuit are operated with the internal voltage and a level shift is performed within the output circuit.

However, in a semiconductor device of a type in which an output of data is performed in synchronization with both edges (a rising edge and a falling edge) of a clock signal, such as a DDR (Double Data Rate) SDRAM (Synchronous DRAM), if a level shift is performed within the output circuit, a skew occurs between output data synchronized with the rising edge and that synchronized with the falling edge. This is caused by the characteristics of the level shift circuit, which occurs because a delay amount of the rising edge and a delay amount of the falling edge are different from each other in a level shift operation.

Such a skew cannot be corrected even if the DLL circuit has a duty correction function, and the skew causes degradation of quality of the output data.

SUMMARY

In one embodiment, there is provided a semiconductor device comprising: a data output terminal; a DLL circuit that generates a first internal clock signal having a first voltage amplitude based on an external clock signal; a first level shift circuit that converts the first internal clock signal into a second internal clock signal having a second voltage amplitude; a second level shift circuit that converts first internal data signals having the first voltage amplitude into second internal data signals having the second voltage amplitude; a clock dividing circuit that generates a plurality of select clock signals including at least a third internal clock signal and a fourth internal clock signal having the second voltage amplitude with different phases from each other based on the second internal clock signal; and an output circuit that sequentially outputs external data signals having the second voltage amplitude from the data output terminal in synchronization with the select clock signals based on the second internal data signals.

In another embodiment, there is provided a method of controlling a semiconductor device, comprising: generating a first internal clock signal having a first voltage amplitude based on an external clock signal; converting the first internal clock signal into a second internal clock signal having a second voltage amplitude; converting first internal data signals having the first voltage amplitude into second internal data signals having the second voltage amplitude; generating a plurality of select clock signals having the second voltage amplitude with different phases from each other based on the second internal clock signal; and outputting external data signals having the second voltage amplitude sequentially from a data output terminal in synchronization with the select clock signals based on the second internal data signal.

According to the present invention, an internal clock signal and an internal data signal are level shifted before they are input to an output circuit and the level-shifted internal clock signal is divided into a plurality of select clock signals. Therefore, even when an output of data is performed in synchronization with a plurality of select clock signals, there occurs no skew between the output data.

Furthermore, because the level shift of the internal clock signal is performed after it is output from a DLL circuit, as long as the internal voltage is lower than the external voltage, it becomes possible to fully achieve a power consumption reducing effect.

BRIEF DESCRIPTION OF THE DRAWINGS

The above features and advantages of the present invention will be more apparent from the following description of certain preferred embodiments taken in conjunction with the accompanying drawings, in which:

FIG. 2A is a circuit diagram of the level shift circuit 200a;

FIG. 2B is an operation waveform diagram of the level shift circuit 200a;

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims.

That is, the technical concept of the present invention is that, in a semiconductor device including an output circuit that includes a clocked driver that divides an internal clock signal into a plurality of select clock signals and outputs an external data signal in synchronization with the select clock signals, an internal data signal is voltage level shifted in advance and the voltage level-shifted data signal is supplied to an output circuit instead that the internal data signal is supplied to the output circuit as it is so that it is voltage level shifted in the output circuit (precisely, the internal data signal is voltage level shifted between the clocked driver that is controlled by a select clock signal and an output transistor that is connected to an external terminal), and at the same time, a voltage level-shifted clock signal obtained by voltage level shifting in advance a the internal clock signal of a single phase is divided into a plurality of select clock signals of a plurality of phases (complementary signals) and the select clock signals are supplied to the output circuit instead that the select clock signals are respectively voltage level shifted and supplied to the output circuit as they are. With this configuration, because the voltage level shift of the internal clock signal is completed before it is divided into a plurality of select clock signals and the voltage level shift of the internal data signal is completed before it is supplied to the clocked driver, there occurs no skew in output data output in synchronization with the select clock signals.

A preferred embodiment of the present invention is explained below with reference to the accompanying drawings.

Figure 1:
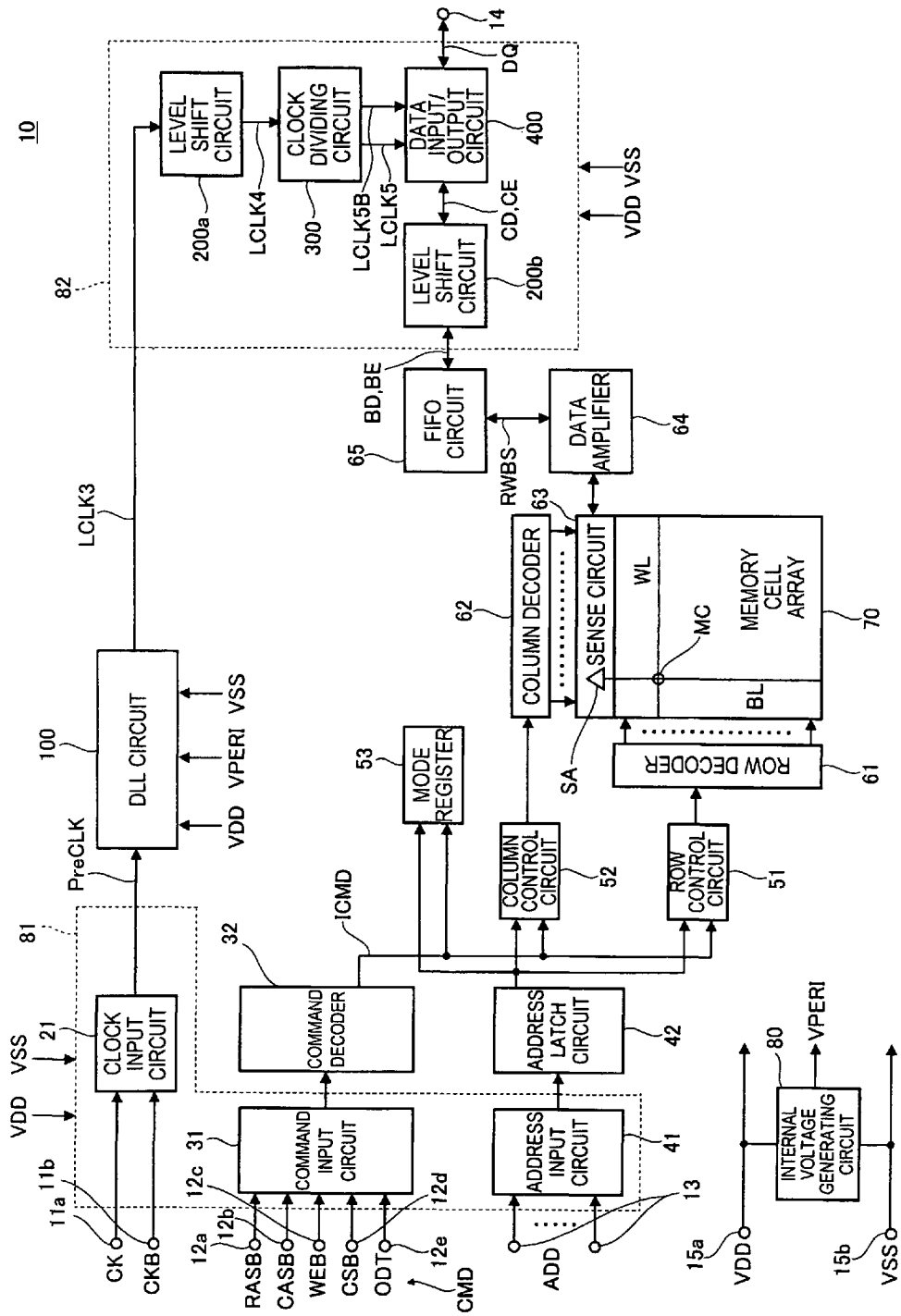
FIG. 1 is a block diagram showing a configuration of a semiconductor device 10 according to the preferable embodiment of the present invention.

FIG. 1 is a block diagram showing a configuration of a semiconductor device 10 according to the embodiment.

The semiconductor device 10 is a DDR SDRAM, and includes, as external terminals, clock terminals 11a and 11b, command terminals 12a to 12e, an address terminal 13, a data input/output terminal (a data output terminal) 14, and power source terminals 15a and 15b. Although not shown in FIG. 1, the semiconductor device 10 also includes a data strobe terminal, a reset terminal and the like.

The clock terminals 11a and 11b are terminals to which external clock signals CK and CKB are supplied, respectively. The external clock signals CK and CKB are then supplied to a clock input circuit 21. In this specification, a signal with "B" attached at its tail means that the signal is an inverted signal of its corresponding signal or an active-low signal. Therefore, the external clock signals CK and CKB are mutually complementary signals. The clock input circuit 21 generates an internal clock signal PreCLK of a single phase based on the external clock signals CK and CKB, and supplies it to a DLL circuit 100. The DLL circuit 100 generates a phase-controlled internal clock signal LCLK3 (a first internal clock signal), and supplies it to a data input/output circuit (an output circuit) 400 via a level shift circuit 200a and a clock dividing circuit 300. The level shift means an operation of converting a voltage amplitude value of a signal, and a circuit having this function is called the level shift circuit.

Although details thereof are described later, the level shift circuit 200a is a circuit that generates an internal clock signal LCLK4 (a second internal clock signal) by performing a level shift of the internal clock signal LCLK3, and the clock dividing circuit 300 is a circuit that generates internal clock signals LCLK5 and LCLK5B (select clock signals) that are complementary signals from the internal clock signal LCLK4 of the single phase. Details on circuit configurations of the DLL circuit 100, the level shift circuit 200a, and the clock dividing circuit 300, and the data input/output circuit 400 are described later.

The command terminals 12a to 12e are terminals to which a row address strobe signal RASB, a column address strobe signal CASB, a write enable signal WEB, a chip select signal CSB, and an on-die termination signal ODT are supplied, respectively. Command signals CMD including the above signals are supplied to a command input circuit 31. The command signals CMD supplied to the command input circuit 31 are then supplied to a command decoder 32. The command decoder 32 is a circuit that generates various internal commands ICMD by storing, decoding, and counting the command signals. The internal commands ICMD are then supplied to a row control circuit 51, a column control circuit 52, and a mode register 53.

The address terminal 13 is a terminal to which an address signal ADD is supplied. The address signal ADD is then supplied to an address input circuit 41. An output of the address input circuit 41 is supplied to an address latch circuit 42. Among the address signal ADD latched in the address latch circuit 42, a row address is supplied to the row control circuit 51, and a column address is supplied to the column control circuit 52. When a mode register set is activated, the address signal ADD is supplied to the mode register 53, thereby contents of the mode register 53 are updated.

An output of the row control circuit 51 is supplied to a row decoder 61. The row decoder 61 is a circuit that selects any one of word lines WL included in a memory cell array 70. In the memory cell array 70, a plurality of word lines WL and a plurality of bit lines BL interest with each other, and a memory cell MC is arranged at every intersection of the word lines WL with the bit lines BL (However, only one word line WL, one bit line BL, and one memory cell MC are shown in FIG. 1). Each of the bit lines BL is connected to its corresponding sense amplifier SA included in a sense circuit 63.

An output of the column control circuit 52 is supplied to a column decoder 62. The column decoder 62 is a circuit that selects any one of the sense amplifiers SA included in the sense circuit 63. The sense amplifier SA selected by the column decoder 62 is connected to a data amplifier 64. The data amplifier 64 further amplifies read data that is amplified by the sense amplifier SA at a time of a read operation, and supplies the amplified read data to a FIFO circuit 65 via a read/write bus RWBS. On the other hand, at a time of a write operation, the data amplifier 64 amplifies write data that is supplied from the FIFO circuit 65 via the read/write bus RWBS, and supplies the amplified write data to the sense amplifier SA. The FIFO circuit 65 is connected to the data input/output circuit 400 via a level shift circuit 200b.

The data input/output terminal 14 is a terminal for performing an output of read data DQ and an input of write data DQ, being connected to the data input/output circuit 400. The complementary internal clock signals LCLK5 and LCLK5B generated by the clock dividing circuit 300 are supplied to the data input/output circuit 400. At the time of the read operation, the data input/output circuit 400 burst outputs the read data DQ in synchronization with the internal clock signals LCLK5 and LCLK5B.

Although only one data input/output terminal 14 is shown in FIG. 1, the number of the data input/output terminal 14 does not have to be one, but can be used in plural as appropriate. A specific example described later (see FIG. 4) exemplifies a case that the number of the data input/output terminal 14 is eight. As is described later, when a plurality of data input/output terminals 14 are arranged, it is necessary to provide the same number of the level shift circuits 200a and 200b, the clock dividing circuit 300, and the data input/output circuit 400.

The power source terminals 15a and 15b are terminals to which an external power source potential VDD and a ground potential VSS are supplied, respectively. In this specification, a voltage between the external power source potential VDD and the ground potential VSS is simply referred to as "external voltage VDD" as appropriate. The external voltage VDD is supplied to an internal voltage generating circuit 80 in which an internal power source potential VPERI that is a potential lower than the external power source potential VDD (VDD>VPERI) is generated. In this specification, a voltage between the internal power source potential VPERI and the ground potential VSS is simply referred to as "internal voltage VPERI" as appropriate.

The internal voltage VPERI is supplied to most of the peripheral circuits shown in FIG. 1, so that most of the peripheral circuits are operated with the internal voltage VPERI as their power sources. Therefore, amplitude values of voltages of signals used in the peripheral circuits are the same as the internal voltage VPERI. On the other hand, the external voltage VDD is supplied to an input circuit group 81 and an output circuit group 82, so that the input circuit group 81 and the output circuit group 82 are operated with the external voltage VDD as their power sources. Therefore amplitude values of voltages of signals used in the input circuit group 81 and the output circuit group 82 are the same as the external voltage VDD. In this manner, as most of the peripheral circuits except for the input circuit group 81 and the output circuit group 82 are operated with the internal voltage VPERI having a lower voltage, it is possible to reduce the power consumption. In the memory cell array 70, an array voltage (VARAY), a high voltage (VPP) exceeding the external voltage VDD, and a negative voltage (VBB) are also used. However, because it is not directly relevant to the scope of the present invention on this regard, explanations thereof will be omitted.

The input circuit group 81 is a circuit group including the input circuits 21, 31, and 41. Therefore, amplitude values of voltages of output signals from the input circuits 21, 31, and 41 are the same as the external voltage VDD. However, because a circuit at the next stage is operated with the internal voltage VPERI, amplitude values of voltages of signals at the following stages become the internal voltage VPERI.

The output circuit group 82 is a circuit group including the level shift circuits 200a and 200b, the clock dividing circuit 300, and the data input/output circuit 400. The level shift circuits 200a and 200b are circuits that convert a signal having the amplitude value of the internal voltage VPERI into a signal having the amplitude value of the external voltage VDD. That is, the level shift circuits 200a and 200b are circuits that shift up an amplitude value of a voltage. Therefore, amplitude values of voltages of signals used in the clock dividing circuit 300 and the data input/output circuit 400 become the external voltage VDD.

Figure 2A:
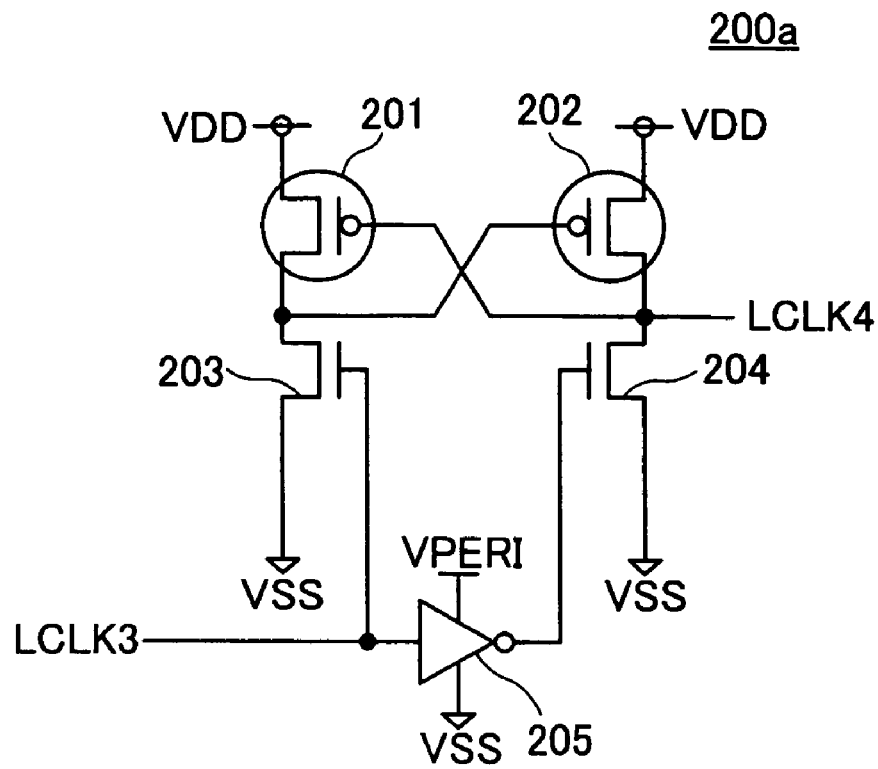
Figure 2B:
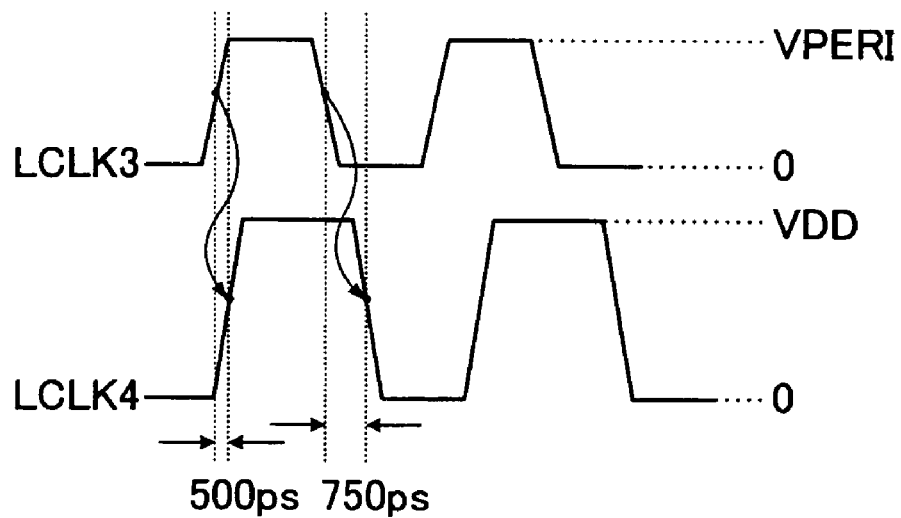

FIG. 2A is a circuit diagram of the level shift circuit 200a, and FIG. 2B is an operation waveform diagram of the level shift circuit 200a.

As shown in FIG. 2A, the level shift circuit 200a includes P-channel MOS transistors 201 and 202 that are cross-coupled to each other with sources being connected to the external power source potential VDD and N-channel MOST transistors 203 and 204 connected to the transistors 201 and 202 in series, respectively, with sources being connected to the ground potential VSS. The internal clock signal LCLK3 of which an amplitude value of a voltage is the internal voltage VPERI is supplied to a gate electrode of the transistor 203, and an inverted signal of the internal clock signal LCLK3 is supplied to a gate electrode of the transistor 204 via an inverter 205. An output is taken from a connection point of the transistors 202 and 204.

With this circuit configuration, as shown in FIG. 2B, when the internal clock signal LCLK3 makes a transition, the internal clock signal LCLK4 that is the output of the level shift circuit 200a also makes a transition. Because an amplitude value of the internal clock signal LCLK4 is the same as the external voltage VDD, it means that the amplitude value of the internal clock signal LCLK4 is a voltage with its amplitude value shifted from the internal voltage VPERI up to the external voltage VDD by the level shift circuit 200a.

The transition of the internal clock signal LCLK3 and the transition of the internal clock signal LCLK4 are not completely synchronized with each other, but there occurs a slight delay in the internal clock signal LCLK4. This delay is different between a rising time and a falling time. The delay at the falling time is larger than the delay at the rising time. In terms of typical numbers, the delay at the rising time is 500 picoseconds (ps), and the delay at the falling time is 750 ps. That is, the delay at the falling time is larger by 250 ps. As a result, a duty ratio of the internal clock signal LCLK4 becomes slightly larger than a duty ratio of the internal clock signal LCLK3.

A circuit configuration of the level shift circuit 200b is the same as that of the level shift circuit 200a shown in FIG. 2A. That is, the level shift circuit 200b has a function of converting internal data signals BD and BE (a first internal data signal) of which an amplitude value of a voltage is VPERI supplied from the FIFO circuit 65 into internal data signals CD and CE (a second internal data signal) of which an amplitude value of a voltage is VDD.

Figure 3:
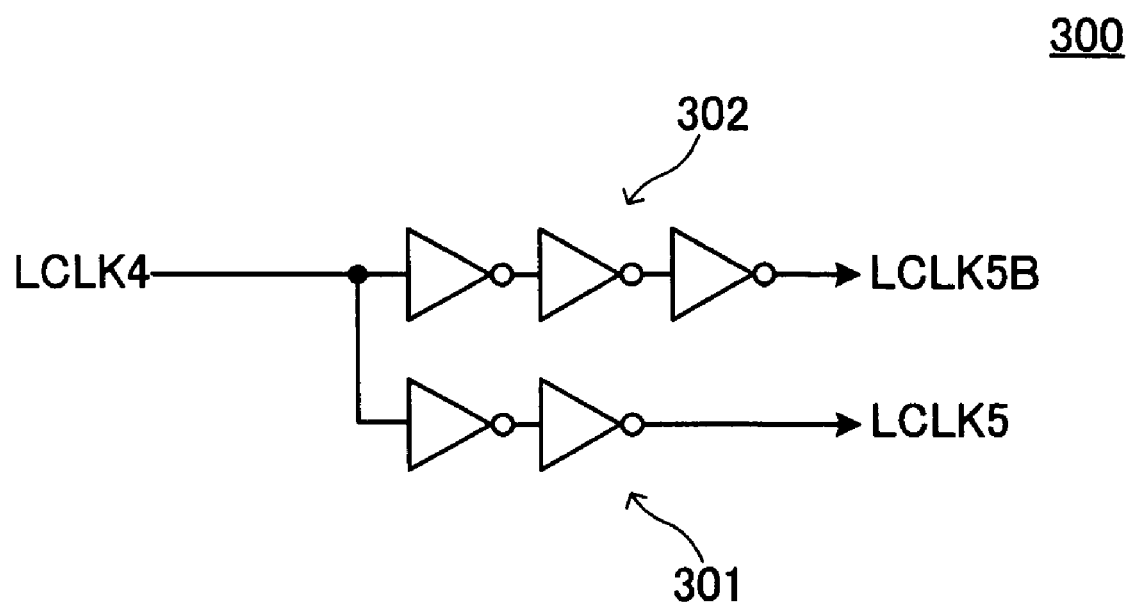
FIG. 3 is a circuit diagram of the clock dividing circuit 300.

FIG. 3 is a circuit diagram of the clock dividing circuit 300.

As shown in FIG. 3, the clock dividing circuit 300 includes a path 301 that is constituted by even-numbered stages of inverters connected in series and a path 302 that is constituted by odd-numbered stages of inverters connected in series. The internal clock signal LCLK4 that is the output of the level shift circuit 200a is input to both of the paths. The internal clock signal LCLK5 is output from the path 301, and the internal clock signal LCLK5B is output from the path 302. Although the number of stages of inverters is different, the paths 301 and 302 are designed to have the same overall signal delay time. As a result, the internal clock signals LCLK5 and LCLK5B make precisely complementary signals.

Figure 4:
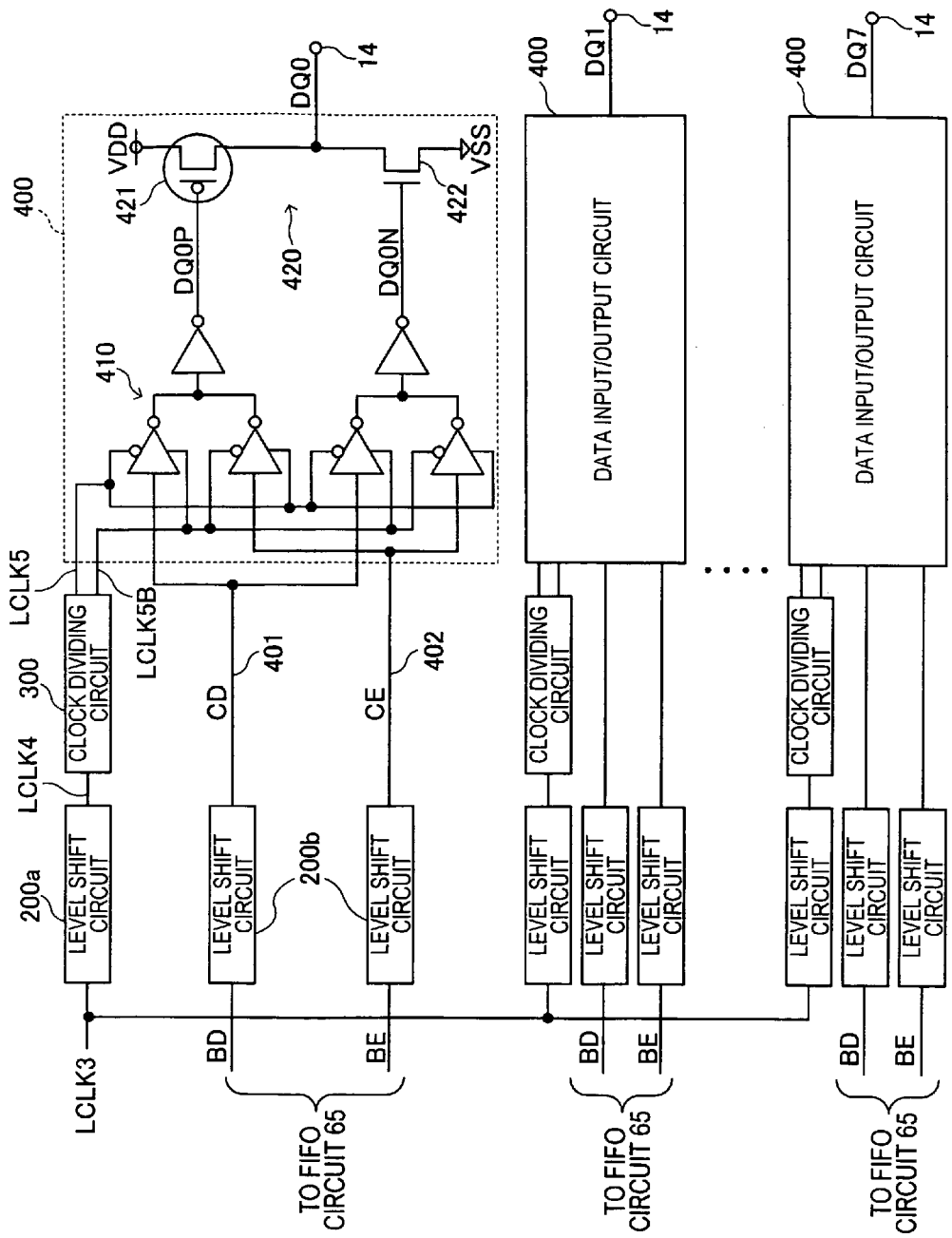
FIG. 4 is a circuit diagram of the data input/output circuit 400 and associated circuits.

FIG. 4 is a circuit diagram of the data input/output circuit 400 and associated circuits.

As shown in FIG. 4, the data input/output circuit 400 includes a multiplexer 410 that receives the internal data signals CD and CE through data lines 401 and 402, respectively, and an output buffer 420 that receives signals DQ0P and DQ0N that are outputs of the multiplexer 410 and outputs read data (an external data signal) DQ0 from the data input/output terminal 14 based on the signals DQ0P and DQ0N.

The multiplexer 410 is a clocked driver that outputs the internal data signal CD supplied through the data line 401 in synchronization with a rising edge of the internal clock signal LCLK5, and at the same time, outputs the internal data signal CE supplied through the data line 402 in synchronization with a rising edge of the internal clock signal LCLK5B. The signals DQ0P and DQ0N that are the outputs of the multiplexer 410 are respectively supplied to gate electrodes of a P-channel MOS transistor 421 (an output transistor) and an N-channel MOS transistor 422 (an output transistor) that constitute the output buffer 420. With this configuration, at the rising edge of the internal clock signal LCLK5, either one of the transistors 421 and 422 is switched on based on a logical level of the internal data signal CD, and an external data signal DQ of a high level or a low level is output. Similarly, at the rising edge of the internal clock signal LCLK5B, either one of the transistors 421 and 422 is switched on based on a logical level of the internal data signal CE, and an external data signal DQ of a high level or a low level is output. With this operation, the external data signal DQ0 is continuously output from the data input/output terminal 14.

Both of the internal data signals CD and CE supplied respectively through the data lines 401 and 402 are signals that went through the level shift circuit 200b. That is, amplitude values of voltages of the internal data signals CD and CE are the same as the external voltage VDD. Therefore, it is not necessary to provide a level shift circuit in the data input/output circuit 400. Furthermore, because the internal clock signals LCLK5 and LCLK5B supplied from the clock dividing circuit 300 are precisely complementary signals already level-shifted as described above, there occurs no skew in the read data DQ0 that are continuously output based on the internal clock signals LCLK5 and LCLK5B.

In FIG. 4, a case that eight data input/output terminals 14 are arranged is shown as an example. That is, in the present example, 8 bits of read data DQ0 to DQ7 are output in parallel. As shown in FIG. 4, when the eight data input/output terminal 14 are arranged, eight sets of the level shift circuits 200a and 200b, the clock dividing circuit 300, and the data input/output circuit 400 are arranged accordingly.

Although not shown in FIGS. 1 and 4, data strobe signals (DQS and DQSB) are also generated in the same way as the read data DQ. In an operation waveform diagram explained below, an effect of the present embodiment is explained using the data strobe signals. It is because the data strobe signals are complementary signals so that it is suitable to use them to explain the effect of the present embodiment.

Figure 5:
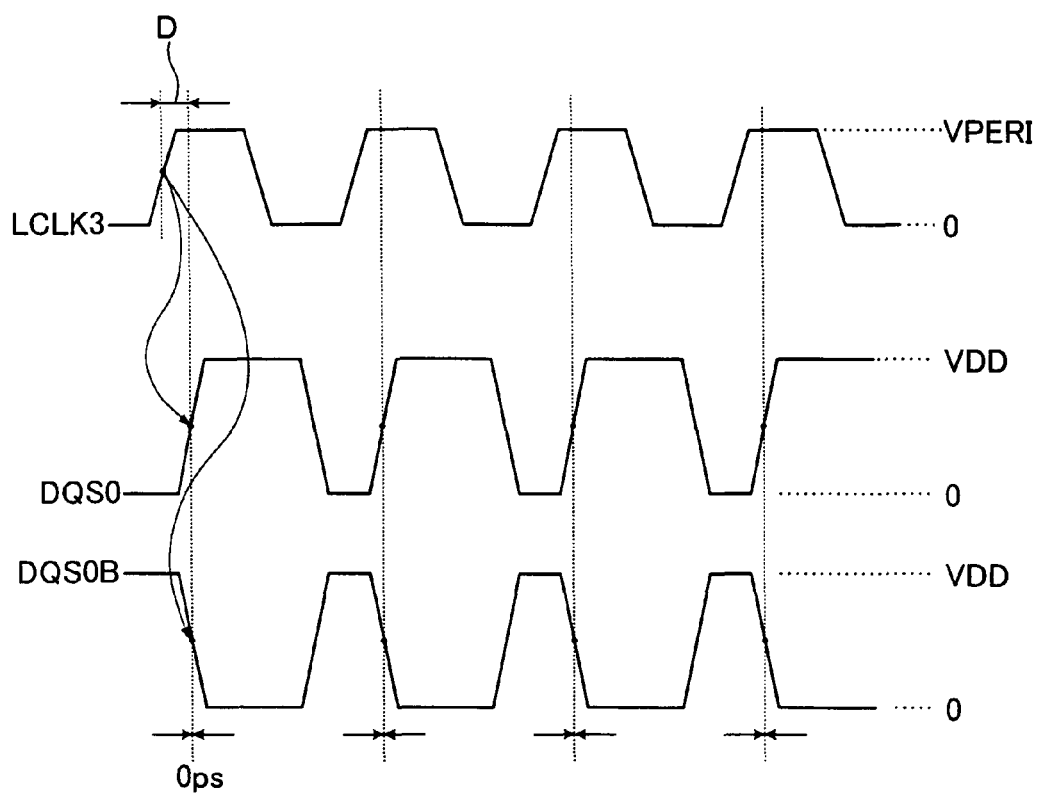
FIG. 5 is an operation waveform diagram for explaining the effect of the present embodiment.

FIG. 5 is an operation waveform diagram for explaining the effect of the present embodiment.

As shown in FIG. 5, when the internal clock signal LCLK3 rises, the data strobe signal DQS rises and the data strobe signal DQSB falls. On the other hand, when the internal clock signal LCLK3 falls, the data strobe signal DQS falls and the data strobe signal DQSB rises. At this moment, there exists a predetermined delay time D between an edge of the internal clock signal LCLK3 and its corresponding edges of the data strobe signals DQS and DQSB. The delay time D is caused by operation delays of various circuits that exist on a signal path, such as the level shift circuit 200a.

However, in the present embodiment, because the amplitude value of the voltage is converted by the level shift circuit 200a before the clock dividing circuit 300 generates the complementary internal clock signals LCLK5 and LCLK5B, as explained with reference to FIG. 2B, there is no skew between the data strobe signals DQS and DQSB (skew=0 ps), even when the delay that occurs at the time of the level shift differs between the rising time and the falling time.

Figure 6:
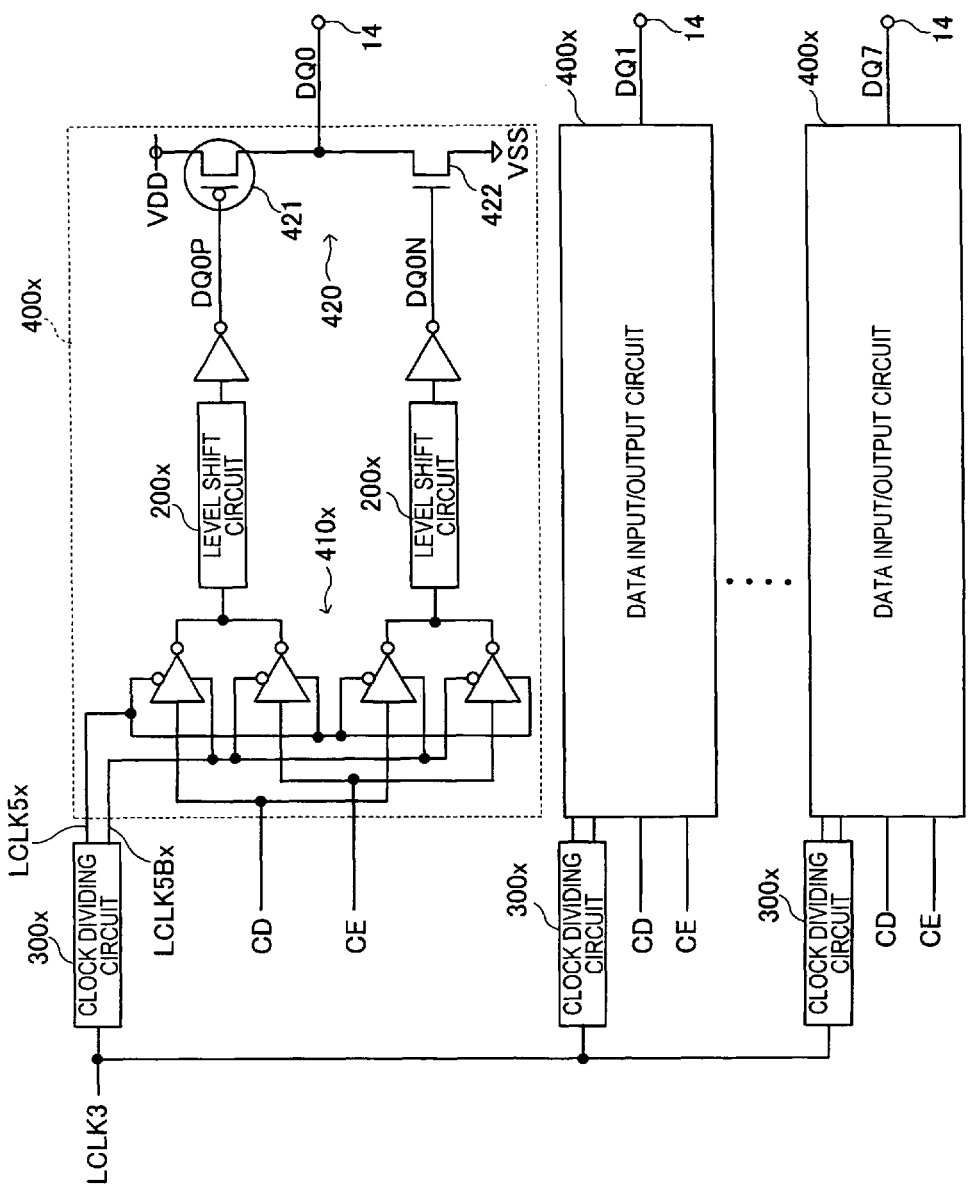
FIG. 6 is a circuit diagram of a data input/output circuit 400x and associated circuits according to a comparative example.

FIG. 6 is a circuit diagram of a data input/output circuit 400x and associated circuits according to a comparative example.

In the comparative example shown in FIG. 6, unlike the present embodiment, an internal clock signal LCLK3 that is not level-shifted is input to a clock dividing circuit 300x, and complementary internal clock signals LCLK5x and LCLK5Bx generated from the internal clock signal LCLK3 are input to a multiplexer 410x. A level shift circuit 200x is arranged at a subsequent stage of the multiplexer 410x, in which a shift up of an amplitude value of a voltage is performed.

Figure 7:
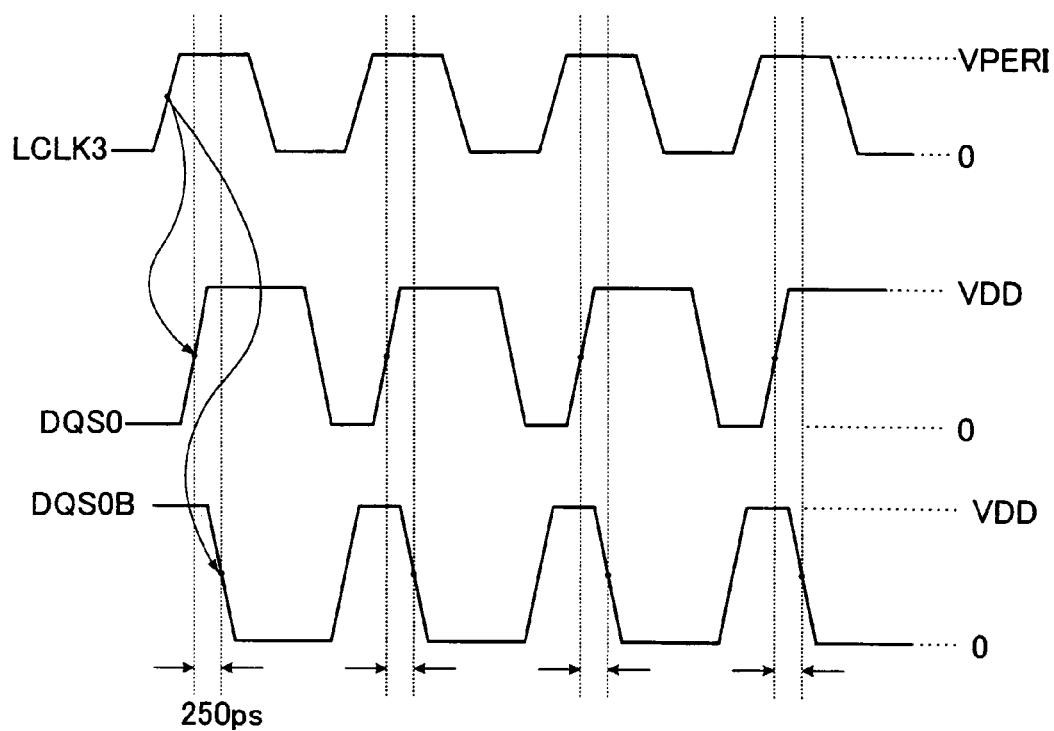
FIG. 7 is an operation waveform diagram for explaining a problem in the comparative example.

FIG. 7 is an operation waveform diagram for explaining a problem in the comparative example.

As shown in FIG. 7, in the comparative example, there occurs a skew between a rising timing of the data strobe signal DQS and a falling timing of the data strobe signal DQSB in response to rising of the internal clock signal LCLK3. Similarly, the same goes for falling of the internal clock signal LCLK3. It is because a level conversion of the internal data signal is performed after taking synchronization of the internal data signals CD and CE with the select clock signals LCLK5 and LCLK5B. That is, the skew generated by the level shift circuit 200x appears as it is in the data strobe signals DQS and DQSB. As the example described above, when the skew generated by the level shift is 250 ps, the skew of 250 ps appears as it is in the data strobe signals DQS and DQSB.

Such a problem does not occur in the present embodiment, which makes it possible to output the read data DQ (and the data strobe signals DQS and DQSB) with no skew.

Figure 8:
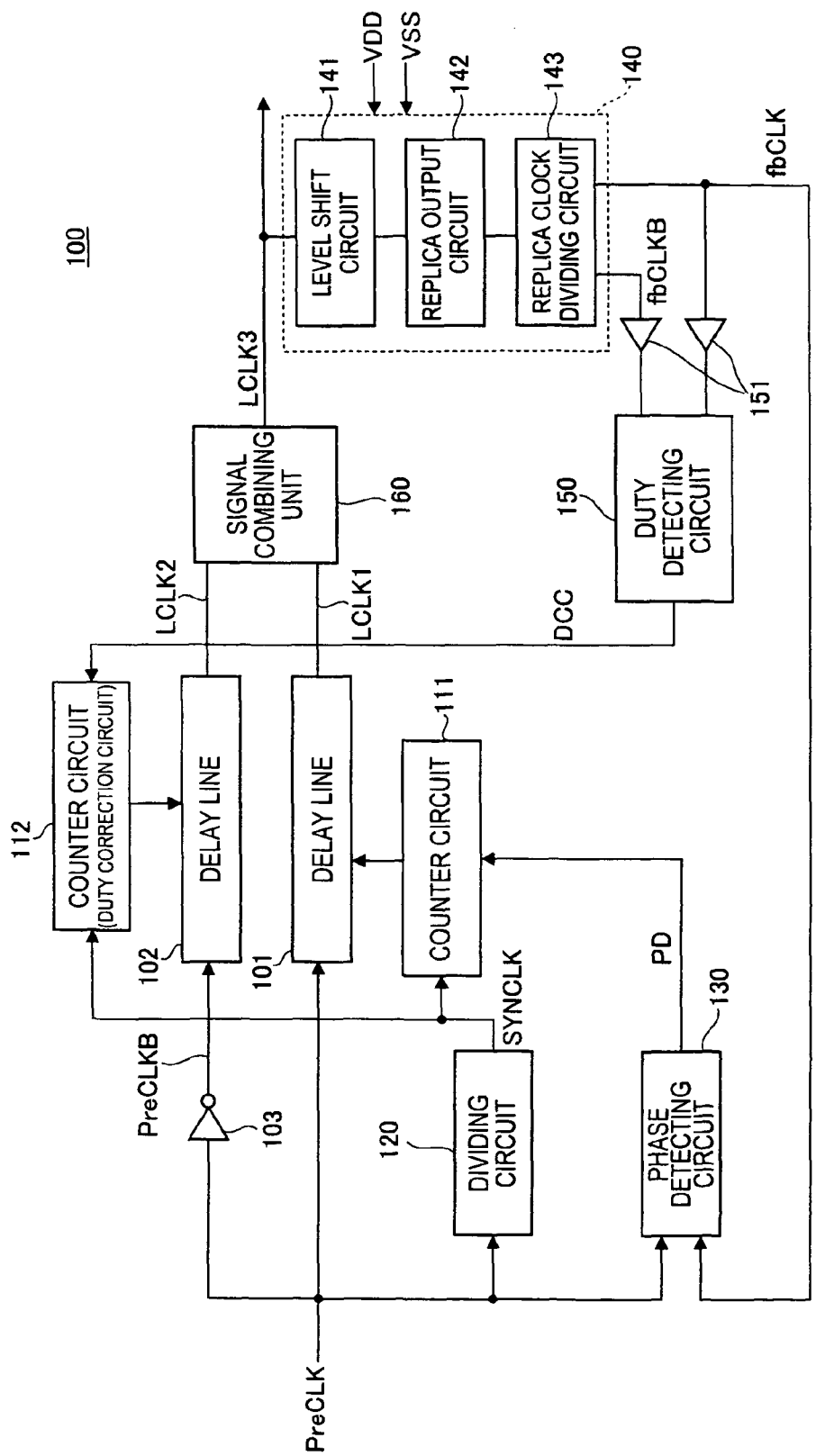
FIG. 8 is a block diagram showing a configuration of the DLL circuit 100.

FIG. 8 is a block diagram showing a configuration of the DLL circuit 100.

As shown in FIG. 8, the DLL circuit 100 includes delay lines 101 and 102, counter circuits 111 and 112, a dividing circuit 120, a phase detecting circuit 130, a feedback circuit 140, a duty detecting circuit 150, and a signal combining unit 160. Among these circuit blocks, the feedback circuit 140 is operated with the external voltage VDD, and the other circuit blocks are operated with the internal voltage VPERI.

The delay line 101 is a circuit that generates an internal clock signal LCLK1 by delaying the internal clock signal PreCLK. An adjustment of a delay amount using the delay line 101 is performed based on a phase difference between the internal clock signal PreCLK and a feedback clock signal fbCLK. The feedback clock signal fbCLK is a signal that is generated by the feedback circuit 140 based on the internal clock signal LCLK3.

On the other hand, the delay line 102 is a circuit that generates an internal clock signal LCLK2 by delaying an internal clock signal PreCLKB obtained by inverting the internal clock signal PreCLK by an inverter 103. An adjustment of a delay amount using the delay line 102 is performed based on a duty ratio of, the feedback clock signal fbCLK.

The internal clock signals LCLK1 and LCLK2 generated by the delay lines 101 and 102 are input to the signal combining unit 160, thereby the internal clock signal LCLK3 is generated.

Although not particularly limited thereto, it is preferable that the delay lines 101 and 102 include a coarse delay line that delays an external clock signal with a relatively coarse adjustment pitch and a fine delay line that delays the external clock signal with a relatively fine adjustment pitch. The delay amount of the delay line 101 is adjusted by a count value of the counter circuit ill, and the delay amount of the delay line 102 is adjusted by a count value of the counter circuit 112.

The count value of the counter circuit 111 is updated in synchronization with a sampling clock signal SYNCLK based on a phase detection signal PD. Specifically, when the phase detection signal PD indicates an excessive phase lead, the counter circuit 111 counts up its count value in synchronization with the sampling clock signal SYNCLK. With this operation, the rising edge of the internal clock signal LCLK1 is delayed. On the other hand, when the phase detection signal PD indicates a phase lag, the counter circuit 111 counts down its count value in synchronization with the sampling clock signal SYNCLK. With this operation, the rising edge of the internal clock signal LCLK1 is advanced. In this manner, the delay line 101 adjusts a position of the rising edge of the internal clock signal LCLK1 based on the phase difference.

The dividing circuit 120 is a circuit that generates the sampling clock signal SYNCLK by frequency dividing the internal clock signal PreCLK. The sampling clock signal SYNCLK is supplied to the counter circuits 111 and 112, and is used as a synchronization signal indicating an update timing of the count values. The reason of using the dividing circuit 120 is because a predetermined time is required for the updates of the counter circuits 111 and 112 and changes of the delay amounts of the delay lines 101 and 102 and it is difficult to perform the updates of the counter circuits 111 and 112 and the changes of the delay amounts of the delay lines 101 and 102 for every cycles of the internal clock signal PreCLK. In addition, it is because the power consumption is considerably increased when the updates of the counter circuits 111 and 112 and the changes of the delay amounts of the delay lines 101 and 102 are performed in a high frequency more than necessary.

The phase detecting circuit 130 is a circuit that detects a phase difference between the internal clock signal PreCLK and the feedback clock signal fbCLK. As described above, the feedback clock signal fbCLK is a signal that is generated by the feedback circuit 140 based on the internal clock signal LCLK3.

Meanwhile, the count value of the counter circuit 112 is updated in synchronization with the sampling clock signal SYNCLK based on a duty detection signal DCC. Specifically, when the duty detection signal DCC indicates a duty ratio less than 50%, the counter circuit 112 counts up its count value in synchronization with the sampling clock signal SYNCLK. With this operation, the rising edge of the internal clock signal LCLK2 is delayed. On the other hand, when the duty detection signal DCC indicates a duty ratio more than 50%, the counter circuit 112 counts down its count value in synchronization with the sampling clock signal SYNCLK. With this operation, the rising edge of the internal clock signal LCLK2 is advanced. In this manner, the delay line 102 adjusts a position of the rising edge of the internal clock signal LCLK2 based on the duty ratio.

The duty detection signal DCC is generated by the duty detecting circuit 150. The duty detecting circuit 150 receives feedback clock signals fbCLK and fbCLKB output from the feedback circuit 140, and detects the duty ratio of the internal clock signal LCLK1 based on the feedback clock signals fbCLK and fbCLKB. Although the feedback clock signals fbCLK and fbCLKB right after being output from the feedback circuit 140 have amplitude values of voltages the same as the external voltage VDD, the amplitude values of the voltages are reduced to the amplitude value of the voltage of the internal voltage VPERI by going through a buffer circuit 151 that is operated with the internal voltage VPERI. Therefore, the amplitude values of the voltages of the feedback clock signals fbCLK and fbCLKB input to the duty detecting circuit 150 are the same as the internal voltage VPERI.

As shown in FIG. 8, the feedback circuit 140 has a configuration in which a level shift circuit 141, a replica output circuit 142, and a replica clock dividing circuit 143 are connected in series.

The level shift circuit 141 has the same circuit configuration as the level shift circuit 200a shown in FIG. 2A. Therefore, the amplitude values of the voltages of the feedback clock signals fbCLK and fbCLKB output from the feedback circuit 140 are the same as the external voltage VDD.

The replica output circuit 142 has substantially the same circuit configuration as the data input/output circuit 400 shown in FIG. 4, having a function of applying the same delay as the delay amount of the data input/output circuit 400 to the feedback clock signals fbCLK and fbCLKB. A size of a transistor included in the replica output circuit 142 is not necessarily to be the same as the size of the transistor included in the output buffer 420, but as long as there is no difference substantially in impedance, a transistor that is subject to shrinking can be used.

The replica clock dividing circuit 143 has substantially the same circuit configuration as the clock dividing circuit 300 shown in FIG. 3, having a function of applying the same delay as the delay amount of the clock dividing circuit 300 to the feedback clock signals fbCLK and fbCLKB. The complementary feedback clock signals fbCLK and fbCLKB that are generated by the replica clock dividing circuit 143 are supplied to the duty detecting circuit 150 via the buffer circuit 151 as described above. The feedback clock signal fbCLK is also supplied to the phase detecting circuit 130. Because the phase detecting circuit 130 is also operated with the internal voltage VPERI, an amplitude value of a voltage of the phase detection signal PD is the same as the internal voltage VPERI.

That is the configuration of the DLL circuit 100. With the above configuration, the internal clock signal LCLK3 generated by the DLL circuit 100 is phase-controlled considering a delay due to the level shift circuit 200a, the clock dividing circuit 300, and the data input/output circuit 400. As a result, phases of the read data DQ and the data strobe signals DQS and DQSB precisely match phases of the external clocks CK and CKB.

Because the amplitude value of the voltage of the internal clock signal LCLK3 that is the output of the DLL circuit 100 is the same as the internal voltage VPERI, not the external voltage VDD, it is possible to operate circuits at the subsequent stages with the internal voltage VPERI. As a result, it is possible to reduce the power consumption compared to the semiconductor device described in Japanese Patent Application Laid-open No. 2001-84763.

Further, because a shift of a duty ratio due to the level shift circuit 200a is reproduced by the level shift circuit 141, the duty ratio of the internal clock signal LCLK3 is adjusted such that the duty ratios of the read data DQ and the data strobe signals DQS and DQSB correctly become 50%. That is, because the characteristics of the level shift circuit 200a, i.e., the characteristics that the delay at the falling time is larger than the delay at the rising time, is canceled not being reflected on the read data DQ and the data strobe signals DQS and DQSB, it becomes possible to achieve high signal quality. Furthermore, an attention needs to be paid to a feature that the level shift circuit 141, the replica output circuit 142, and the replica clock dividing circuit 143 are included in the feedback circuit, and the output of the replica clock dividing circuit 143 (a plurality of complementary signals fbCLK and fbCLKB) similar to the output waveform of the clock dividing circuit 300 is input to the duty detecting circuit 150, so that each signal in the data input/output circuit 400 is completely simulated.

In the DLL circuit 100 described above, because a clock signal of which an amplitude value of a voltage is shifted up to the external voltage VDD by the level shift circuit 141 is supplied to the replica output circuit 142, operation conditions of the replica output circuit 142 and the data input/output circuit 400 completely match each other. As a result, it is possible to reproduce a signal delay due to the data input/output circuit 400 in a more precise manner.

Figure 9:
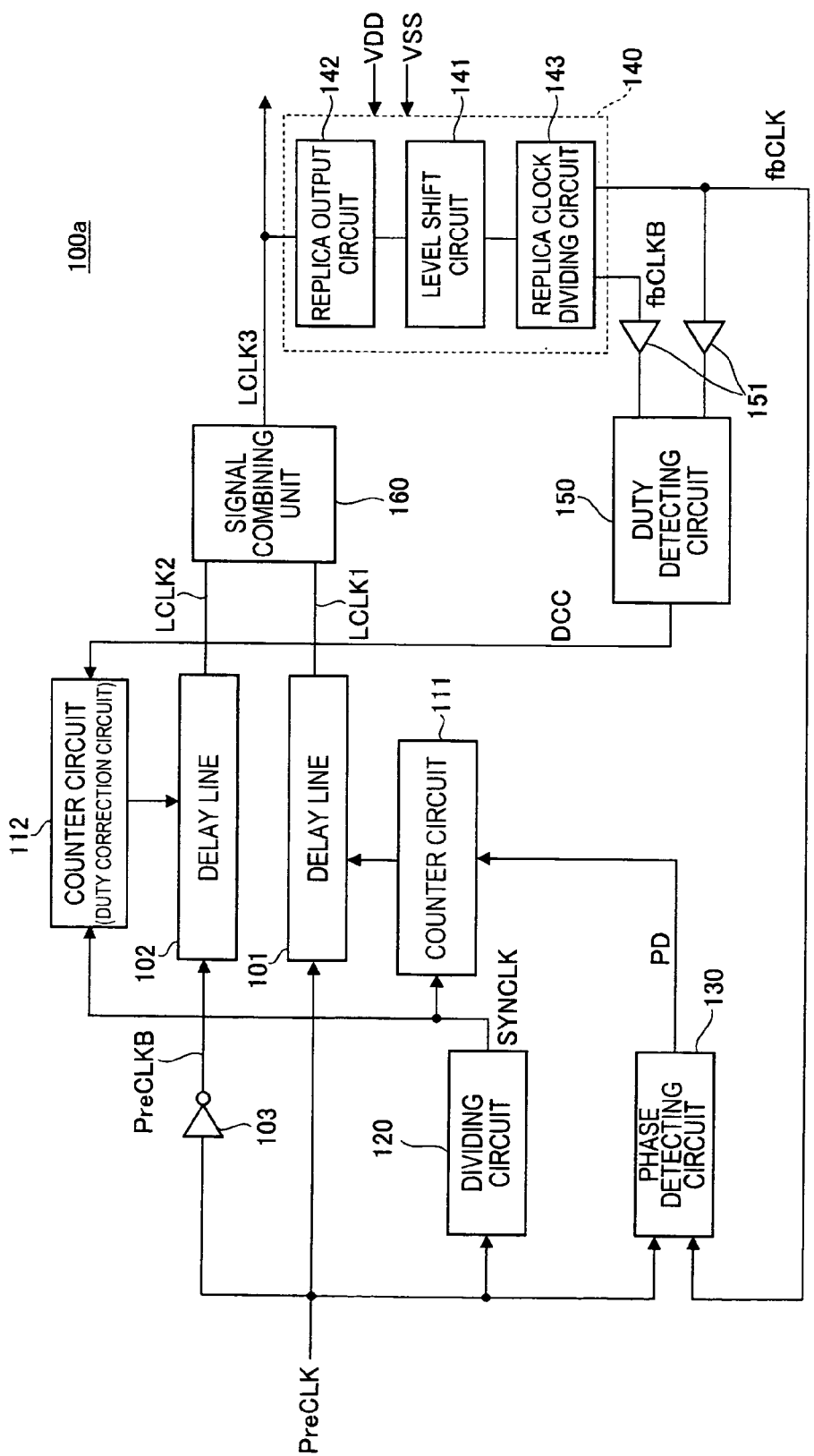
FIG. 9 is a block diagram showing a configuration of the DLL circuit 100a according to another embodiment of the present invention.

FIG. 9 is a block diagram showing a configuration of the DLL circuit 100a according to another embodiment of the present invention.

The DLL circuit 100a shown in FIG. 9 is different from the DLL circuit 100 shown in FIG. 8 in that the level shift circuit 141 and the replica output circuit 142 included in the feedback circuit 140 are opposite to each other in position. Other than that, the DLL circuit 100a is the same as the DLL circuit 100 shown in FIG. 8. According to the DLL circuit 100a shown in FIG. 9, because the internal clock signal LCLK3 before the level shift is supplied to the replica output circuit 142, it is possible to more reduce the power consumption.

Figure 10:
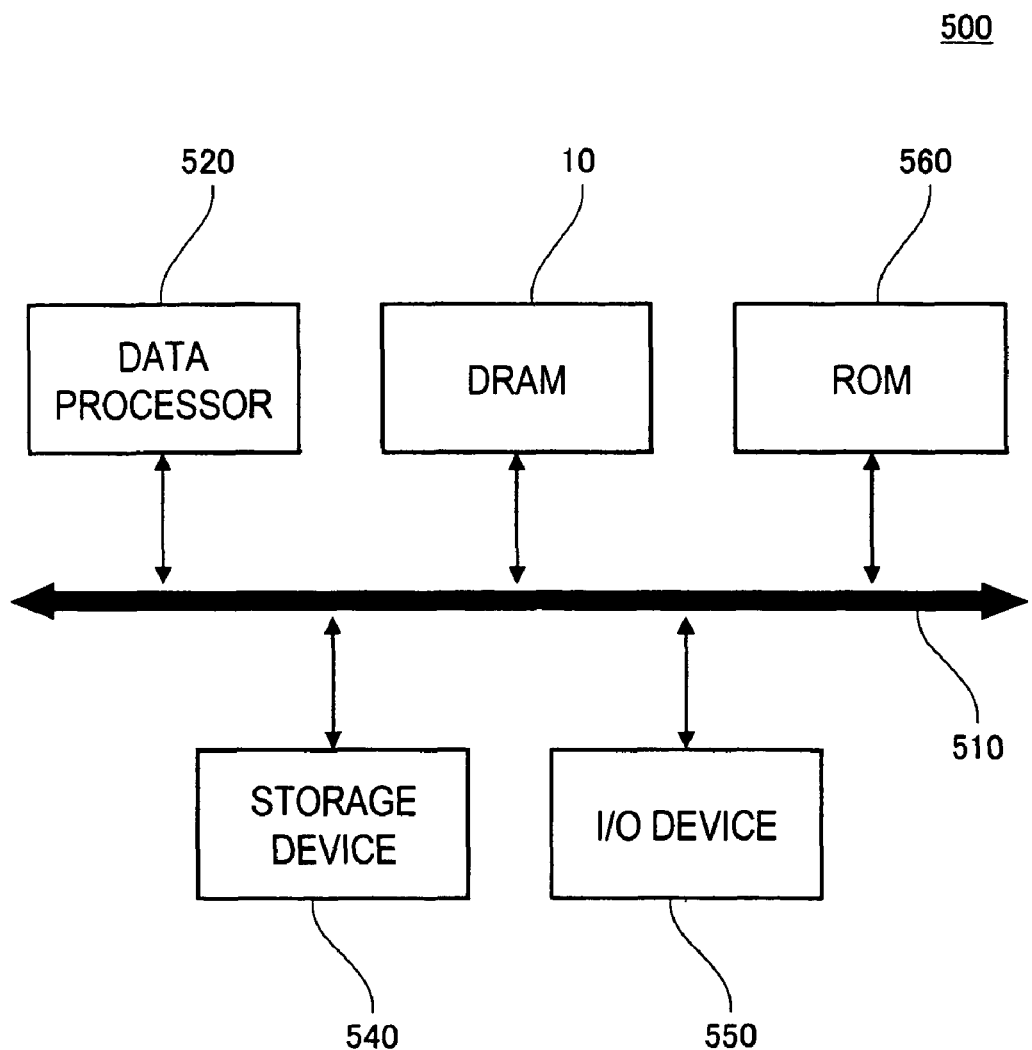
FIG. 10 is a block diagram showing a configuration of a data processing system 500 that includes the semiconductor memory device 10 according to the preferable embodiment of the present invention.

FIG. 10 is a block diagram of a data processing system 500 that includes the semiconductor memory device 10 according to the preferable embodiment of the present invention.

In the data processing system 500 shown in FIG. 10, a data processor 520 and the semiconductor memory device (DRAM) 10 according to the present embodiment are interconnected via a system bus 510. For example, the data processor 520 can be a microprocessor (MPU), a digital signal processor (DSP) or the like, but is not limited thereto. For the sake of simplification, the data processor 520 and the DRAM 10 are connected via the system bus 510 in FIG. 10. Alternatively, the data processor 520 and the DRAM 10 can be connected by a local bus.

For the sake of simplification, only one set of the system bus 510 is shown in FIG. 10. Plural sets of system buses can be provided in series or parallel, as required, by connecting through one or more connectors and the like. In the data processing system 500 shown in FIG. 10, a storage device 540, an I/O device 550, and a ROM 560 are connected to the system bus 510. However, these are not essential.

The storage device 540 can be a hard disk drive, an optical disk drive, a flash memory and the like. The I/O device 550 can be a display device such as a liquid crystal display and the like, and an input device such as a keyboard, a mouse and the like. Further, the I/O device 550 can be either the input device or the output device. For the sake of simplification, only one each of the constituent elements of the data processing system 500 is shown in FIG. 10. Two or more of all the constituent elements or a part thereof can be provided.

It is apparent that the present invention is not limited to the above embodiments, but may be modified and changed without departing from the scope and spirit of the invention.

While the above embodiments have been described by taking an SDRAM having a DLL circuit incorporated therein as an example, the scope that the present invention is applied is not limited thereto, and the present invention can be also applied to semiconductor devices other than memories. Specifically, the invention of the present application can be applied to general semiconductor products having a DLL circuit incorporated therein, such as a CPU (Central Processing Unit), an MCU (Micro Control Unit), a DSP (Digital Signal Processor), an ASIC (Application Specific Integrated Circuit), or an ASSP (Application Specific Standard Circuit).

The present invention can be applied to semiconductor devices such as SOC (system on chip), MCP (multi chip package), and POP (package on package). Further, the transistors of the present invention can be FET (Field Effect Transistors) and bipolar transistors. The transistors can be also various types of FET such as MIS (Metal-Insulator Semiconductor) transistors and TFTs (Thin Film Transistor) and the like. The transistors can be transistors except FETs. The transistors can partially include bipolar transistors.

Further, a P-channel transistor or a PMOS transistor is a typical first-conductive transistor, an N-channel MOS transistor or an NMOS transistor is a typical second-conductive transistor. In addition, the semiconductor substrate is not limited to a P-type semiconductor substrate, but can be an N-type semiconductor substrate, an SOI (Silicon on Insulator), or other types of semiconductor substrates.

In addition, a circuit form of a level shift circuit or a data input/output circuit is not limited to the circuit form disclosed in the embodiment.

Many combinations or selections of the various disclosed elements can be made without departing from the scope of the invention. That is, the invention of course includes various modifications and changes that can be made by those skilled in the art based on the entire disclosure including the appended claims and technical concepts of the invention.

What is claimed is:
1. A semiconductor device comprising:
   a data output terminal;
   a Delay Locked Loop (DLL) circuit that generates a first internal clock signal having a first voltage amplitude based on an external clock signal;
   a first level shift circuit that converts the first internal clock signal into a second internal clock signal having a second voltage amplitude;
   a second level shift circuit that converts first internal data signals having the first voltage amplitude into second internal data signals having the second voltage amplitude;
   a clock dividing circuit that generates a plurality of select clock signals including at least a third internal clock signal and a fourth internal clock signal having the second voltage amplitude with different phases from each other based on the second internal clock signal; and
   an output circuit that sequentially outputs external data signals having the second voltage amplitude from the data output terminal in synchronization with the select clock signals based on the second internal data signals.
2. The semiconductor device as claimed in claim 1, further comprising an internal voltage generating circuit that receives an external voltage that defines the second voltage amplitude and generates an internal voltage that defines the first voltage amplitude based on the external voltage.
3. The semiconductor device as claimed in claim 2, wherein the internal voltage is lower than the external voltage.

4. The semiconductor device as claimed in claim 1, further comprising a plurality of data lines including at least a first data line and a second data line, wherein
the output circuit includes:
a multiplexer that selects anyone of the second internal data signals each of which is supplied through an associated one of the data lines; and
an output buffer that receives the second internal data signal selected by the multiplexer and outputs the external data signal from the data output terminal based on the second internal data signal, and
the multiplexer selects any one of the second internal data signals supplied through an associated one of the data lines in synchronization with an associated one of the select clock signals.

5. The semiconductor device as claimed in claim 4, wherein
the third and fourth internal clock signals are complementary signals, and
the multiplexer selects the second internal data signal supplied through the first data line in synchronization with an active edge of the third internal clock signal and selects the second internal data signal supplied through the second data line in synchronization with an active edge of the fourth internal clock signal.

6. The semiconductor device as claimed in claim 4, wherein
the DLL circuit includes:
a delay line that generates the first internal clock signal by delaying the external clock signal;
a feedback circuit that generates a feedback clock signal based on the first internal clock signal; and
an adjusting circuit that compares phases of the feedback clock signal and the external clock signal and changes a delay amount of the delay line based on a result of comparing the phases, and
the feedback circuit includes:
a replica output circuit having a substantially same delay amount as a delay amount of the output circuit;
a third level shift circuit that converts the first internal clock signal having the first voltage amplitude into the feedback clock signal having the second voltage amplitude; and
a replica clock dividing circuit having a substantially same delay amount as a delay amount of the clock dividing circuit.

7. The semiconductor device as claimed in claim 6, wherein the replica output circuit is arranged at a subsequent stage of the third level shift circuit to which the first internal clock signal is supplied, thereby the feedback clock signal having the second voltage amplitude is supplied to the replica output circuit, and an output signal of the replica output circuit is supplied to the replica clock dividing circuit.

8. The semiconductor device as claimed in claim 6, wherein the third level shift circuit is arranged at a subsequent stage of the replica output circuit to which the first internal clock signal is supplied, thereby the feedback clock signal having the second voltage amplitude is supplied to the replica clock dividing circuit.

9. The semiconductor device as claimed in claim 1, wherein
a plurality of the data output terminals are provided, and
the first level shift circuit, the second level shift circuit, the clock dividing circuit, and the output circuit are provided for each of the data output terminals.

10. The semiconductor device as claimed in claim 1, wherein
the DLL circuit includes:
a delay line that generates the first internal clock signal by delaying the external clock signal;
a feedback circuit that generates a feedback clock signal based on the first internal clock signal; and
an adjusting circuit that compares phases of the feedback clock signal and the external clock signal and changes a delay amount of the delay line based on a result of comparing the phases, and
the feedback circuit includes:
a replica output circuit having a substantially same delay amount as a delay amount of the output circuit;
a third level shift circuit that converts the first internal clock signal having the first voltage amplitude into the feedback clock signal having the second voltage amplitude; and
a replica clock dividing circuit having a substantially same delay amount as a delay amount of the clock dividing circuit.

11. The semiconductor device as claimed in claim 10, wherein the replica output circuit is arranged at a subsequent stage of the third level shift circuit to which the first internal clock signal is supplied, thereby the feedback clock signal having the second voltage amplitude is supplied to the replica output circuit, and an output signal of the replica output circuit is supplied to the replica clock dividing circuit.

12. The semiconductor device as claimed in claim 11, wherein
the DLL circuit includes:
a duty detection circuit that receives the feedback clock signal and detects a duty ratio of the first internal clock signal; and
a duty correcting circuit that corrects the duty ratio of the first internal clock signal based on a result of detection by the duty detecting circuit.

13. The semiconductor device as claimed in claim 12, wherein the DLL circuit further includes a buffer circuit that is arranged between the replica clock dividing circuit and the duty detecting circuit, and converts a voltage amplitude of the feedback clock signal from the second voltage amplitude into the first voltage amplitude.

14. The semiconductor device as claimed in claim 10, wherein the third level shift circuit is arranged at a subsequent stage of the replica output circuit to which the first internal clock signal is supplied, thereby the feedback clock signal having the second voltage amplitude is supplied to the replica clock dividing circuit.

15. The semiconductor device as claimed in claim 14, wherein
the DLL circuit includes:
a duty detection circuit that receives the feedback clock signal and detects a duty ratio of the first internal clock signal; and
a duty correcting circuit that corrects the duty ratio of the first internal clock signal based on a result of detection by the duty detecting circuit.

16. The semiconductor device as claimed in claim 15, wherein the DLL circuit further includes a buffer circuit that is arranged between the replica clock dividing circuit and the duty detecting circuit, and converts a voltage amplitude of the feedback clock signal from the second voltage amplitude into the first voltage amplitude.

17. The semiconductor device as claimed in claim 10, wherein the DLL circuit includes:
a duty detecting circuit that receives the feedback clock signal and detects a duty ratio of the first internal clock signal; and
a duty correction circuit that corrects the duty ratio of the first internal clock signal based on a result of detection by the duty detecting circuit.

18. The semiconductor device as claimed in claim 17, wherein the DLL circuit further includes a buffer circuit that is arranged between the replica clock dividing circuit and the duty detecting circuit, and converts a voltage amplitude of the feedback clock signal from the second voltage amplitude into the first voltage amplitude.

19. A method of controlling a semiconductor device, comprising:
generating a first internal clock signal having a first voltage amplitude based on an external clock signal;
converting the first internal clock signal into a second internal clock signal having a second voltage amplitude;
converting first internal data signals having the first voltage amplitude into second internal data signals having the second voltage amplitude;
generating a plurality of select clock signals having the second voltage amplitude with different phases from each other based on the second internal clock signal; and
outputting external data signals having the second voltage amplitude sequentially from a data output terminal in synchronization with the select clock signals based on the second internal data signal.

20. A data processing system comprising:
the semiconductor device; and
a controller that supplies an external clock signal to the semiconductor device and receives external data signals from the semiconductor device, wherein
the semiconductor device comprises:
a data output terminal;
a Delay Locked Loop (DLL) circuit that generates a first internal clock signal having a first voltage amplitude based on the external clock signal;
a first level shift circuit that converts the first internal clock signal into a second internal clock signal having a second voltage amplitude;
a second level shift circuit that converts first internal data signals having the first voltage amplitude into second internal data signals having the second voltage amplitude;
a clock dividing circuit that generates a plurality of select clock signals including at least a third internal clock signal and a fourth internal clock signal having the second voltage amplitude with different phases from each other based on the second internal clock signal; and
an output circuit that sequentially outputs the external data signals having the second voltage amplitude from the data output terminal in synchronization with the select clock signals based on the second internal data signals.

* * * * *